United States Patent [19]
Nakano

[11] Patent Number: 5,555,422
[45] Date of Patent: Sep. 10, 1996

[54] PROBER FOR SEMICONDUCTOR INTEGRATED CIRCUIT ELEMENT WAFER

[75] Inventor: Shoukichi Nakano, Kawasaki, Japan

[73] Assignee: Co-operative Facility for Aging Tester Development, Kanagawa-ken, Japan

[21] Appl. No.: 547,383

[22] Filed: Oct. 24, 1995

Related U.S. Application Data

[63] Continuation of Ser. No. 199,392, Feb. 22, 1994, abandoned.

[30] Foreign Application Priority Data

| Mar. 10, 1993 | [JP] | Japan | 5-087721 |
| Sep. 2, 1993 | [JP] | Japan | 5-218704 |
| Dec. 14, 1993 | [JP] | Japan | 5-313538 |

[51] Int. Cl.$^6$ .................................................. C01R 31/02
[52] U.S. Cl. .......................... 324/754; 324/757; 324/762
[58] Field of Search .................................... 324/754, 762, 324/757

[56] References Cited

U.S. PATENT DOCUMENTS

| 4,585,727 | 4/1986 | Reams . | |
| 4,820,976 | 4/1989 | Brown . | |
| 4,987,365 | 1/1991 | Shreeve et al. . | |
| 5,130,644 | 7/1992 | Ott . | |
| 5,172,050 | 12/1992 | Swapp . | |
| 5,177,438 | 1/1993 | Littlebury et al. | 324/754 |
| 5,198,757 | 3/1993 | Azumai | 324/754 |

FOREIGN PATENT DOCUMENTS 8711463.1  9/1988  Germany .

WO91/12706  8/1991  WIPO .

OTHER PUBLICATIONS

Patent Abstract of Japan, vol. 12, No. 46 (P–665) Feb. 12, 1988 & JP-A-62 192 674 Furuno Electric, Aug. 24, 1986.

*Primary Examiner*—Kenneth A. Wieder
*Assistant Examiner*—Kourosh Cyrus Khosravi
*Attorney, Agent, or Firm*—Keck, Mahin & Cate

[57] ABSTRACT

One type of a prober for use in making measurement or aging of electric circuit elements and parts such as semiconductor integrated circuits is used for testing the electrical performance of semiconductor integrated circuit elements formed on the semiconductor substrate, and comprises a prober substrate of which thermal expansion coefficient is substantially same as that of the semiconductor substrate. The prober substrate has a plurality of leads at its center portion, said leads correspond to the pads of the semiconductor integrated circuit element, each lead has a contact to abut on the corresponding pad, and said prober substrate has conductive layers formed thereon each having one end extending to said contact and other end terminating in the vicinity of the circumference of the prober substrate. Another type of a prober comprises a plurality of contacts to abut on the corresponding pads of an object to be tested; an electric circuit means for making electric connections between said contacts and the main system; and an actuators for permitting each of contacts or each group of contacts to be selectively abutted on or selectively removed from the pads of the object.

9 Claims, 11 Drawing Sheets

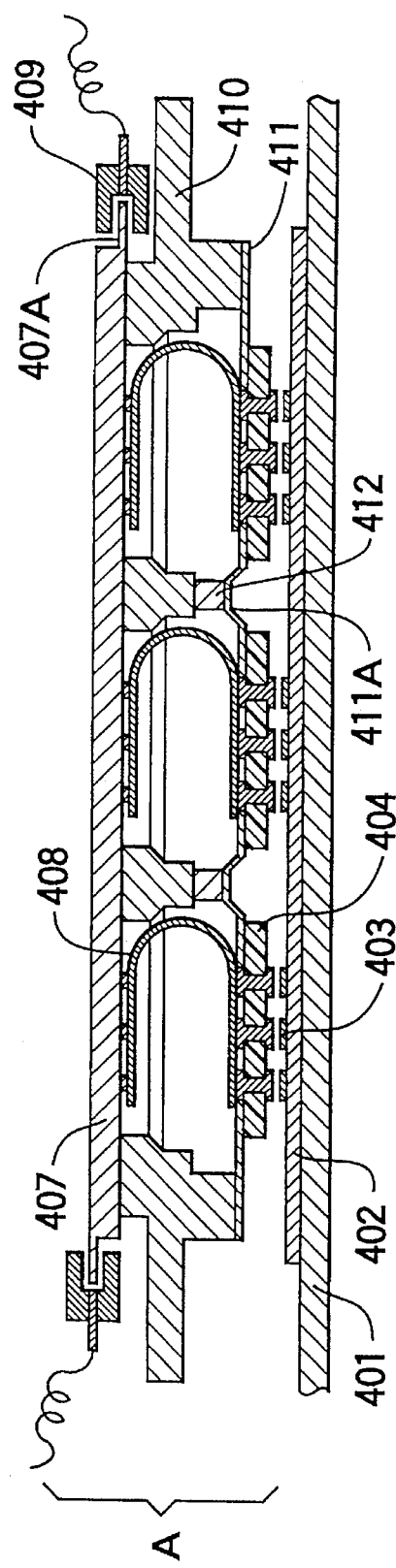
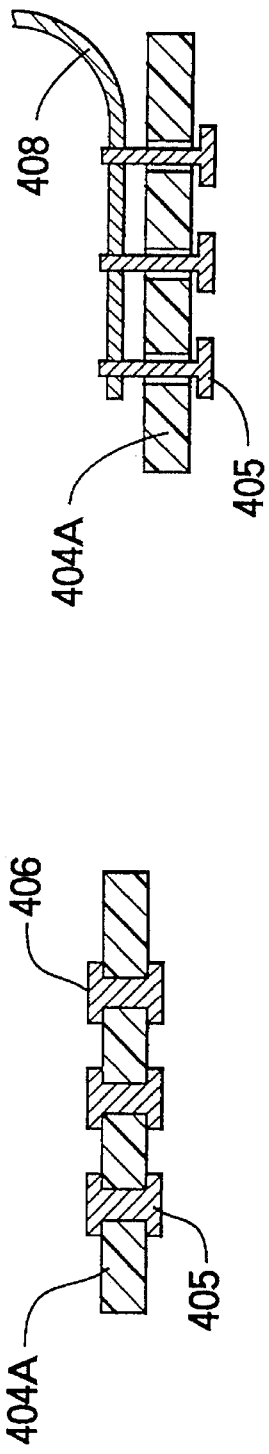
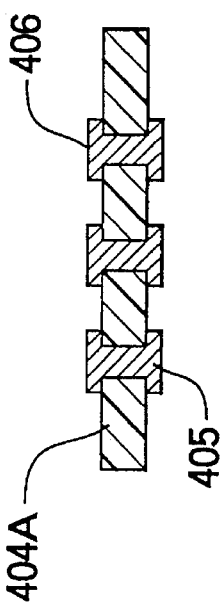

PROBER FOR SEMICONDUCTOR INTEGRATED CIRCUIT ELEMENT WAFER

This is a continuation of Ser. No. 08/199.392, filed on Feb. 22, 1994, abandoned.

BACKGROUND OF THE INVENTION

1. Field of the Invention

The present invention relates to a prober for use in making required measurements or aging tests on electric circuit elements or parts such as semiconductor integrated circuits and, more particularly, to a microprober for such a purpose.

2. Description of Related Art

Recently, there have been developed and used systems for making required characteristic measurements or aging tests on objects to be tested such as, for example, IC (Integrated Circuit) elements formed on surfaces of silicon or other semiconductor substrates, which systems are referred to as "main systems" hereinafter. Such main systems require probers for precisely and reliably making contact with pads of the objects to be tested in order to make electric connections between those pads of the objects and the main systems.

There has been an ever increasing demand for such probers that are capable of making simultaneous probing of a plurality of separate objects, or of a plurality of objects all produced on a single wafer, because defective products are detected and rejected by the characteristic measurements or aging tests on the products while they are still in wafer level and prior to dicing of wafers, thereby allowing non-defective products to proceed to subsequent steps. Such pre-selection will substantially improve the efficiency with which integrated circuits are produced, and will be particularly advantageous to the selling of integrated circuits in the form of pellets, which is commonly called "chip selling".

It is, however, very difficult to conduct high-precision and reliable probing of a plurality of objects, such as wafers, simultaneously because such objects are liable to be somewhat deformed after being subjected to different processings in the course of making integrated circuits. Hitherto, elongated metal needles have been used to get access to the objects to be tested from the circumference thereof. Some probers have a large number of elongated needles embedded in their bases with the associated springs.

Disadvantageously, such probers, using elongated needles, are large in size compared with objects to be tested and, therefore, simultaneous probing of numerous objects is impossible. Particularly, probers using spring-biased needles require high-precision machining and, therefore, it is almost impossible to make such probers perfect enough to permit simultaneous probing of a plurality of objects to be tested. Such probers are not suitable for mass production and, if actually made, would be very expensive.

An accelerated aging is effected in heating and cooling cycles ranging from the room temperature to 125° C. If the thermal expansion coefficients of probers are different from those of objects to be tested, prior art probers cannot assure good contact with such objects. As a tendency, wafers have been increasing in size to, say, eight inches and, accordingly, such large-sized wafers are liable to cause increased thermal expansion. It has, therefore, been difficult for such prior art probers to make the simultaneous probing of a large number of objects or elements and/or parts on such a large-sized wafer.

The difficulty with which simultaneous probing is effected will increase with an increase in the number of objects because of the difficulty in assuring good contacts between probers' contacts and objects' pads due to the warp or unevenness of wafers. In order to overcome such a circumstance, a prober has been designed with such a size that it includes only one or a few contact blocks having contacts corresponding the pads of one object to be tested. Such a prober is operated to sequentially move across the objects for making measurement thereof. As a matter of course, a burn-in operation which requires the simultaneous probing of all objects is impossible.

The probers handling a plurality of objects are often designed so as to permit different signals such as chip select, chip enable and output enable signals to be directed to the selected objects via a common bus including data and address lines, thus permitting sequential access to individual objects.

Consequently, presence of any defective element among those under simultaneous probing for measurements or tests may cause an adverse effect on the level of address or data information from other elements accessed, and therefore, wrong information may result.

SUMMARY OF THE INVENTION

An object of the present invention is to provide a new and improved prober which is free of such defects as described above, permitting the simultaneous probing of numerous objects such as IC elements with high-precision and reliability.

According to a first aspect of the present invention, there is provided a prober for use in testing the electric performance of a plurality of objects to be tested formed on a generally flat substrate. The prober comprises a prober substrate having substantially the same thermal expansion coefficient as that of the flat substrate. The prober substrate has a probing section at its center portion, said probing section having a plurality of leads corresponding to the pads of each object, each lead having a contact adapted to abut on the corresponding pad of the object when the prober substrate is laid on the flat substrate. The prober substrate has a plurality conductive layers, each layer having one end extending to the contact and another end terminating in the vicinity of the circumference of the prober substrate.

According to a second aspect of the present invention, there is provided a prober for use in testing the electric performance of semiconductor integrated circuit elements formed on a semiconductor substrate. The prober comprises a prober substrate having substantially the same thermal expansion coefficient as that of the semiconductor substrate. The prober substrate has a probing section at its center portion, said probing section having a plurality of leads corresponding to the pads of each semiconductor integrated circuit element, each lead having a contact adapted to abut on the corresponding pad of the element when the prober substrate is laid on the semiconductor substrate. The prober substrate has a plurality conductive layers, each layer having one end extending to the contact and other end terminating in the vicinity of the circumference of the prober substrate.

According to a third aspect of the present invention, there is provided a prober equipped with a plurality of contacts adapted to abut on the corresponding pads of an object to be tested. An electric circuit means makes electric connections between the contacts and the main system, and an actuator permits each of the contacts, or each group of contacts, to be selectively abutted on or selectively released from the pads of the object.

According to a fourth aspect of the present invention, there is provided a prober for use in testing the electrical performance of a plurality of objects to be tested formed on a generally flat substrate. The prober has a plurality of contact blocks, each including individual contacts corresponding to the pads of the objects. A plurality of movable base plates is used to move the associated contact block to the pads of the objects, and support means is provided to support the contact blocks relative to the movable base plates in such a way that the contacts of the contact blocks may be adaptively abutted on the pads of the objects on the flat substrate.

According to a fifth aspect of the present invention, there is provided a prober for use in testing the electrical performance of a plurality of objects to be tested formed on a generally flat substrate. The prober has a plurality of contact blocks, each including individual contacts corresponding to the pads of the objects. A plurality of movable base plates is used to move the associated contact block to the pads of the objects, and damping means is placed between the contact blocks and the movable base plates in such a way that the contacts of the contact blocks may be adaptively abutted on the pads of the objects on the flat substrate.

BRIEF DESCRIPTION OF THE DRAWINGS

Other objects and advantages of the present invention will be understood from the following description of probers according to the preferred embodiments of the present invention, which are shown in accompanying drawings, in which:

FIG. 14 is a sectional view of a prober according to the eighth embodiment, showing how the prober is applied to a selected object;

FIG. 15 is a sectional view of a selected contact block in the prober of FIG. 14;

FIG. 16 is a similar sectional view, but showing a different example of contact block;

DESCRIPTION OF THE PREFERRED EMBODIMENTS

Figure 1:
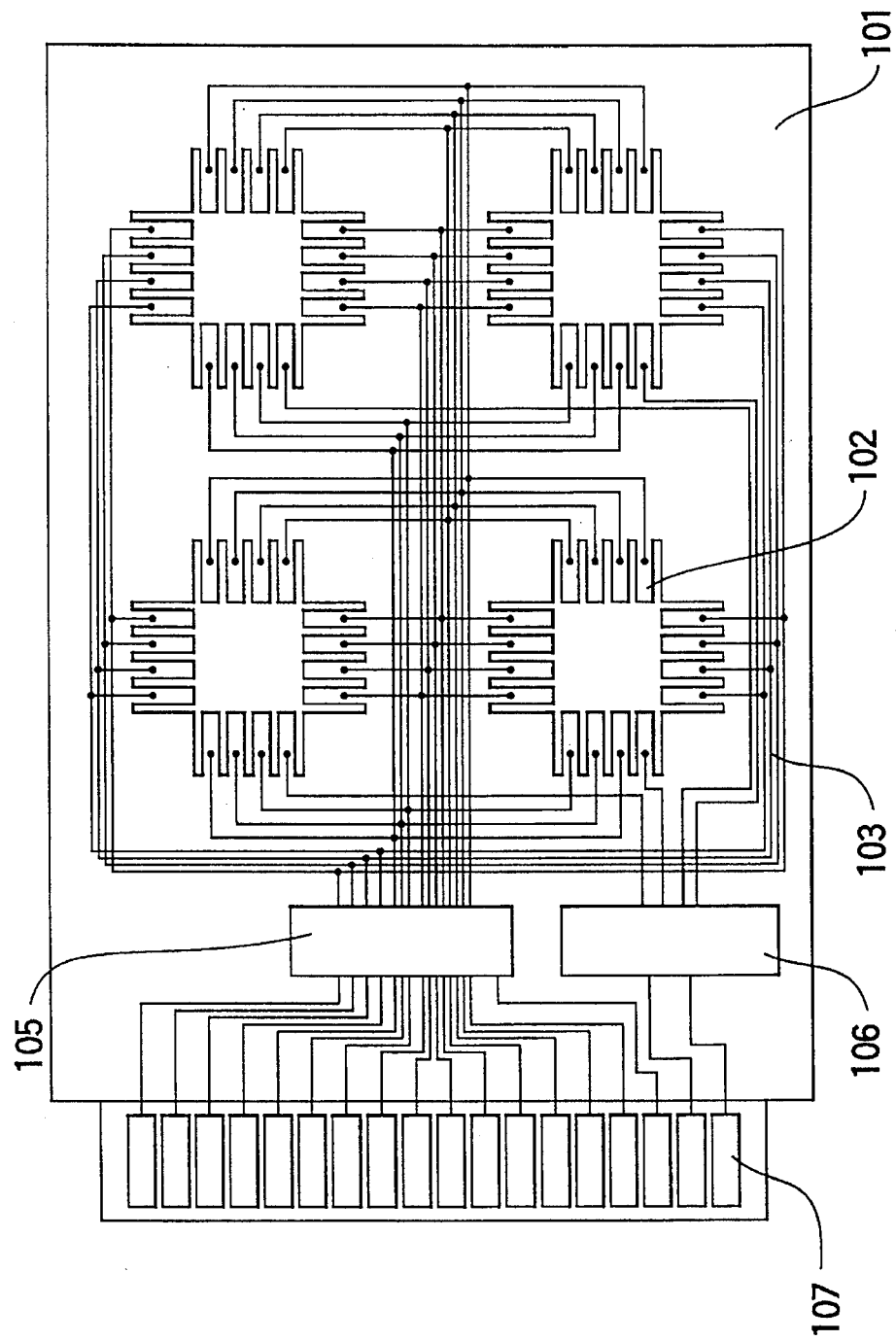
FIG. 1 is a plane view of the substrate of a prober, according to the first embodiment of the present invention, showing the structure of the prober substrate.

Prior to description of preferred embodiments, the principle of the present invention is described below. In order to solve the problems of prior art probers as described above, it is necessary to have the space which the probing section occupies be smaller than the area of an object to be tested. The prober must be flexible enough to put its leads in good contact with the pads of selected objects, no matter how they may be deformed in the course of production. Also, the prober substrate has to have the same thermal expansion coefficient as the object's substrate, thereby assuring that the prober substrate is put in good contact with the object while being subjected to aging.

To meet these requirements, the prober must be so designed that its unit probing section has an occupying space equal to or smaller than that of a single IC element to be tested. Also, the prober must be resilient or flexible enough to allow its leads to keep close contact with the pads of the IC element irrespective of possible deformation of the semiconductor wafer.

To assure that the prober is kept in good contact with the wafer while being exposed to repeated heating and cooling cycles, it is proposed that a prober substrate material having a thermal expansion coefficient which is substantially the same as the wafer be selected and, therefore, the prober substrate is made of glass, ceramics or semiconductors, and may be lined with metal whose thermal expansion coefficient is substantially same as the wafer, thereby reinforcing the prober substrate. Specifically, the prober substrate may be of a semiconductor material whose crystalline orientation is similar to the wafer, and each probing section of the prober is oriented relative to the wafer so as to allow its crystalline orientation to be in alignment with the crystalline orientation of the wafer, thereby minimizing the possible positional deviation of the contacts of the prober from the pads of the object caused by thermal expansion or contraction.

Comb-shaped leads of the probing section are formed on the prober substrate so as to be in conformity with the pads of the IC element formed on the wafer of the object, and each comb-shaped lead is physically modified, particularly in thickness, size, shape or composition, thereby improving its adaptability. Also, electric circuit patterns are formed on the prober substrate by conductive coatings or conductive layers and, at the same time, metal projections are formed on the electric circuit patterns at the ends of the leads to provide contacts relative to corresponding pads of an object to be tested.

Silicon or other semiconductor materials, and glass or ceramic materials of substantial thickness, are fragile, but the flexibility of these materials will increase with the decrease of thickness. The resiliency of such materials may be increased by hardening. The substrate of such materials is comb-shaped, and the teeth (i.e. leads or "reeds") or the surrounding areas of the comb-shaped substrate are physically modified in thickness, size, shape or composition, thereby endowing the leads with adaptability appropriate for the purpose of probing. Metal pieces of small thermal expansion coefficient coated with dielectric material may be used for the same purpose.

Such a comb shape can be formed by photographic and chemical processing, electric discharge machining or high-precision machining. It should be noted that selected areas of the semiconductor substrate which are to be subjected to electric discharge machining are made electrically conductive by increasing the concentration of impurities.

Electric circuit patterns can be formed on prober substrates by plating or evaporating metal thereon or by applying metal foils thereto. If prober substrates are of semiconductor material, electric circuit patterns can be formed by diffusion of impurities into the semiconductor substrates. Some other metal plating and electroforming techniques may be used to form electric circuit patterns on the substrate.

Likewise, metal plating and electroforming techniques and other appropriate techniques, such as are used in producing printed circuit boards and integrated circuits, may be used to form projections of platinum, rhodium, nickel or any other anti-wearing, hard metal on the lead ends.

It is proposed that individual contacts, corresponding to individual pads of the object to be tested, are selected as a unit to be controlled as a whole, or groups or blocks of contacts corresponding to groups or blocks of pads are also selected as units to be controlled as a whole, thereby enabling persons to conduct collective controls of connecting or disconnecting selected leads from counter pads, adjusting contact pressures on selected pads and other required controls, thereby collecting data pertaining to individual objects to make a decision on each object as to which object should be rejected or passed, providing a good/defect (permission/rejection) map on an associated memory so that the probing of objects may be electively effected on non-defective objects to avoid adverse affect which, otherwise, would be caused by defective objects if present among those under test.

Now the probers constructed in accordance with the principle of the present invention will be described with reference to the accompanying drawings.

Figure 2:
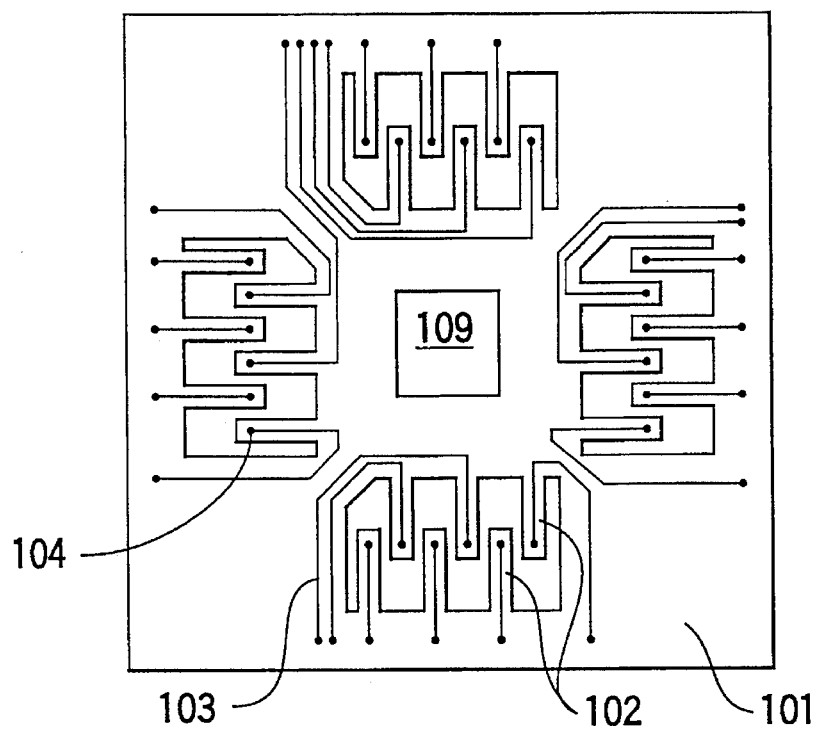
FIG. 2 is a plane view of the rear side of one selected probing section of the prober.

Referring to FIG. 1, a prober according to first embodiment of the present invention is shown. The prober comprises a prober substrate having four sets of probing sections thereon. Each of the probing sections includes comb-shape portions at four sides thereof corresponding, in numbers of teeth and positions, to the pads of an object to be tested. Each comb-shape portion comprises leads or "reeds" 102 each having a circuit path 103 made of an electrically conductive layer and a contact 104 as shown in FIG. 2.

Figure 3:
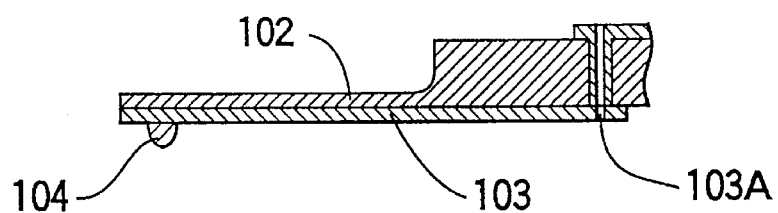
FIG. 3 is a longitudinal section of a selected lead structure in the prober.

The circuit paths 103 are generally collected together on the prober substrate 101 via through-holes 103A (see FIG. 3) to provide data or address bus lines. It is noted here that the prober substrate is provided with a bus buffer 105 for improving data transfer characteristics of the bus and a decoder 106 for decoding external assignment codes to access the selected probing section. Such a decoder enables the use of a common bus for all probing sections so that connection means 107 may have a lower number of lines for connecting between the circuit paths 103 and the external circuits.

As described above, a substantially thicker prober substrate 101 is required for keeping the entire strength or rigidity therefor, while the leads 102 must have flexibility enough to accommodate the possible deformation or unevenness of the wafer during the production thereof. Such flexibility is attainable by any of the techniques including selection of size, shape, composition and configuration of the leads. If more flexibility is required, the same techniques may also be applied to the portions around the leads 102.

In order to further increase the entire strength of the prober substrate 101, it may be lined with an additional substrate or structural member using such material that has thermal expansion coefficient substantially equal to that of the prober substrate 101.

Recently there have increasingly been provided such IC elements that have higher packaging density of integrated circuits, complicated configurations and a large number of pads. For such IC elements, according to the present invention, a probing section may be designed to include interdigitated comb-shape portions 102 as shown in FIG. 2.

The material for the prober substrate may be selected among those including semiconductor material such as silicon; glass; ceramic; and metal with insulation coating. If semiconductor material is used for the prober substrate, it can provide higher density of circuit paths 103 which are formed of conductive layers by the same processing techniques as those of IC elements. Furthermore, if the crystalline orientation of the semiconductor material is similar to the wafer and the prober substrate is disposed relative to the wafer so as to allow its crystalline orientation to be in alignment with that of the wafer, such semiconductor substrate can minimize the possible positional deviation of the contacts 104 of the prober from the pads of the object caused by thermal expansion or contraction.

If metal is used for the prober substrate, it must have substantially the same thermal expansion coefficient and restoring characteristics as that of the object to be tested and must be provided with an additional insulation coating or insulation film by thin film coating or application techniques. In such a case, however, it is noted that there may be a possibility of some deficiencies, such as lower operation speed, due to the increase of stray capacitance for the circuit paths 103, a requirement of a complicated machining technique and the like.

Figure 4:
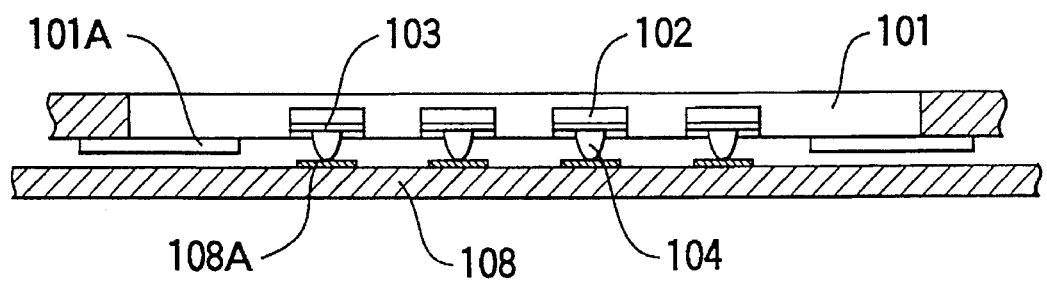
FIG. 4 is a sectional view of the prober, showing how a selected probing section of the prober is applied to a selected object.

In actually making a measurement or aging test on the wafer, the pads of the object to be tested on the wafer are aligned with the contacts 104 on the prober substrate 101 and thereafter the prober substrate 101 is pressed against the wafer to abut the contacts 104 on the pads of the object. According to the present invention, even if excessive pressure is applied, breakage of the probing section due to such excessive pressure can be avoided by the provision of a pressure receiving portion 101A of the substrate 101. More specifically, such a pressure receiving portion 101A is formed on the substrate 101 at the area other than the probing section and is pressed against the wafer 108 at the area other than the pads 108A, as shown in FIG. 4.

It is noted that if the pressure receiving portion 101A is, or is in combination with, an insulation layer/film or a resilient film, both the object and the circuit paths 103 will be more completely protected against such excessive pressure.

For the purpose of making alignment of pads 108A of the object to be tested with the contacts 104 of the prober substrate 101, it is preferred that the prober substrate 101 is made optically transparent because of common practice of an optical system used for such an alignment purpose.

According to the present invention, glass or ceramic material which is transparent to visible light, ultraviolet rays or infrared rays can be used for prober substrate 101. Such transparent material, together with clearance around the probing section, facilitates alignment of the pads 108A and the contacts 104. If desired, an opening 109 may be provided at the position other than the circuit paths 103 for such purpose.

The comb-shape portion of the probing section can be formed by photographic and chemical processing, electric discharging machining or high-precision machining. It should be noted that selected areas of the semiconductor substrate which are to be subjected to electric discharge machining are made electrically conductive by increasing the concentration of impurities.

Electrically conductive films or layers can be formed on prober substrates by plating or evaporating metal thereon or by applying metal foils thereto. If prober substrates are of semiconductor material, such electrically conductive films or layers can be formed by diffusion of impurities into the semiconductor substrates.

Likewise, metal plating and electroforming techniques and other appropriate techniques used in producing printed circuit boards and integrated circuits may be used to form the contacts or projections of the probing sections. More specifically, they may be formed by creating a basic pattern on the probing sections with resist material and then plating of platinum, rhodium, nickel or any other anti-wearing, hard metal. Thereafter, photographic processing using photoresist may additionally be applied.

Figure 5:
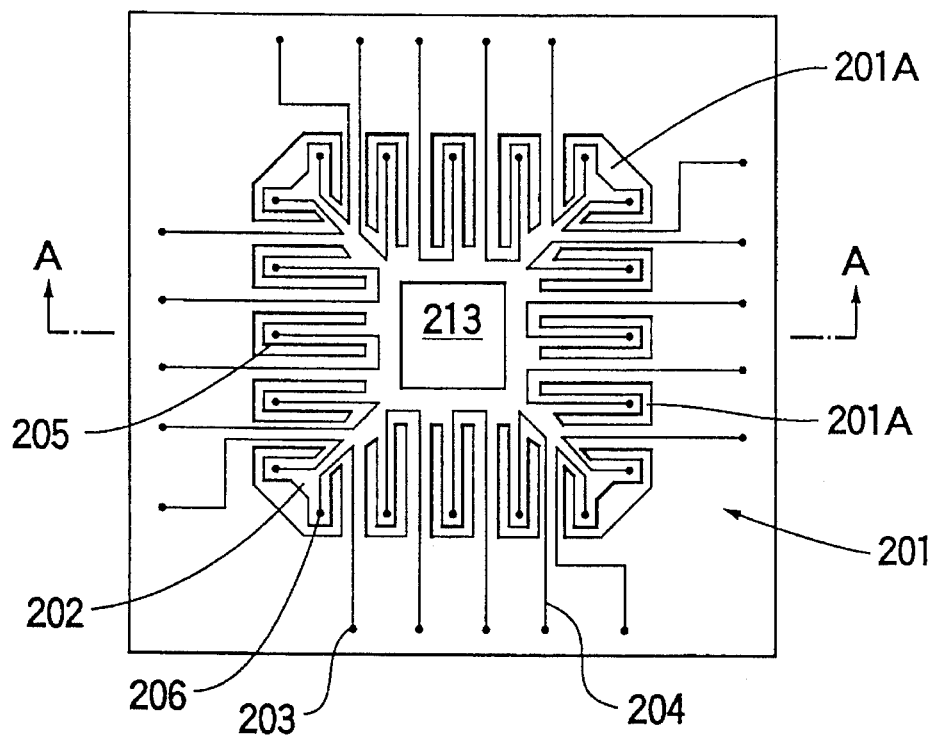
FIG. 5 is a plane view of a unit prober according to the second embodiment of the present invention.
Figure 7:
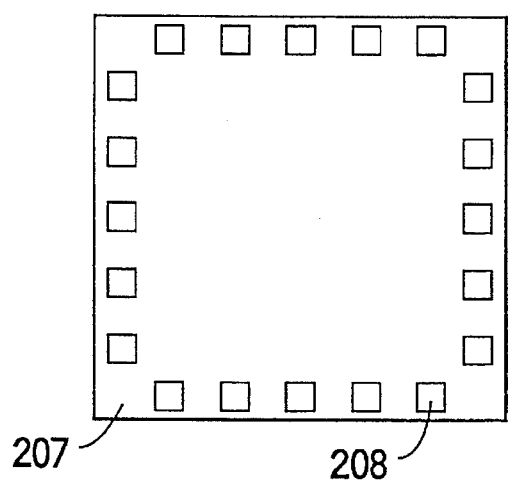
FIG. 7 is a plane view of one example of an object having a plurality of integrated circuits formed on its substrate.

Referring to FIG. 5, a unit prober according to a second embodiment of the present invention is shown. This unit prober is designed to probe an IC element formed on a substrate 207 as shown in FIG. 7. Such an IC element has the pads 208 on the periphery of the substrate 207.

The prober in FIG. 5 comprises a generally flat prober substrate 201 which has a central square opening 213 for facilitating alignment of the prober with the object to be tested. The prober substrate 201 includes a probing section 202 around the central opening 213. The probing section 202 has a plurality of leads 205 in comb-shape geometry which are formed by the provision of a plurality of generally "C" shaped clearances 201A and which extend from inside towards the peripheral portion of the substrate 201. The leads 205 correspond in number and their positions to pads 208 of the object, i.e. IC element, to which the prober is applied.

Contacts 206 for making contact with the pads 208 of IC element are provided near the outer end portions of the leads 205, respectively. In addition, the prober substrate 210 includes a plurality of electrically conductive layers 204 each having one end connected to each contact 206 and another end connected to the corresponding terminal 203 adjacent the peripheral edge of the prober substrate, thereby forming electric circuit paths to an external testing unit.

Figure 6:
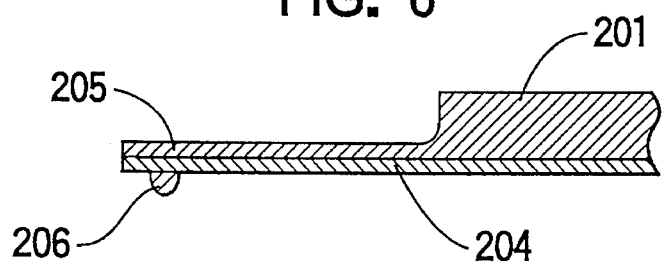
FIG. 6 is a longitudinal section of a selected lead structure in the prober at an enlarged scale.

FIG. 6 is an enlarged sectional view of a portion of the lead 205 of FIG. 5. It is apparent from FIG. 6 that the thickness of the lead 205 is decreased relative to the remaining portion of the prober substrate 201. This is because both of the following requirements should be met: the prober substrate 201 must have substantial thickness for keeping the entire strength or rigidity therefor, and the leads 205 must have a flexibility high enough to keep in good contact with the pads while accepting any possible warp or deformation of the wafer due to thermal variation. Although this embodiment shows the reduced thickness of the leads 205, another approach, including selection of different shape, size and composition for the leads 205, can achieve the same purpose.

Alternatively, the entire strength of the prober may be increased by lining the prober substrate 201 with a reinforcement member formed of metal or ceramic material having substantially the same thermal expansion coefficient as that of the prober substrate 201.

Figure 8:
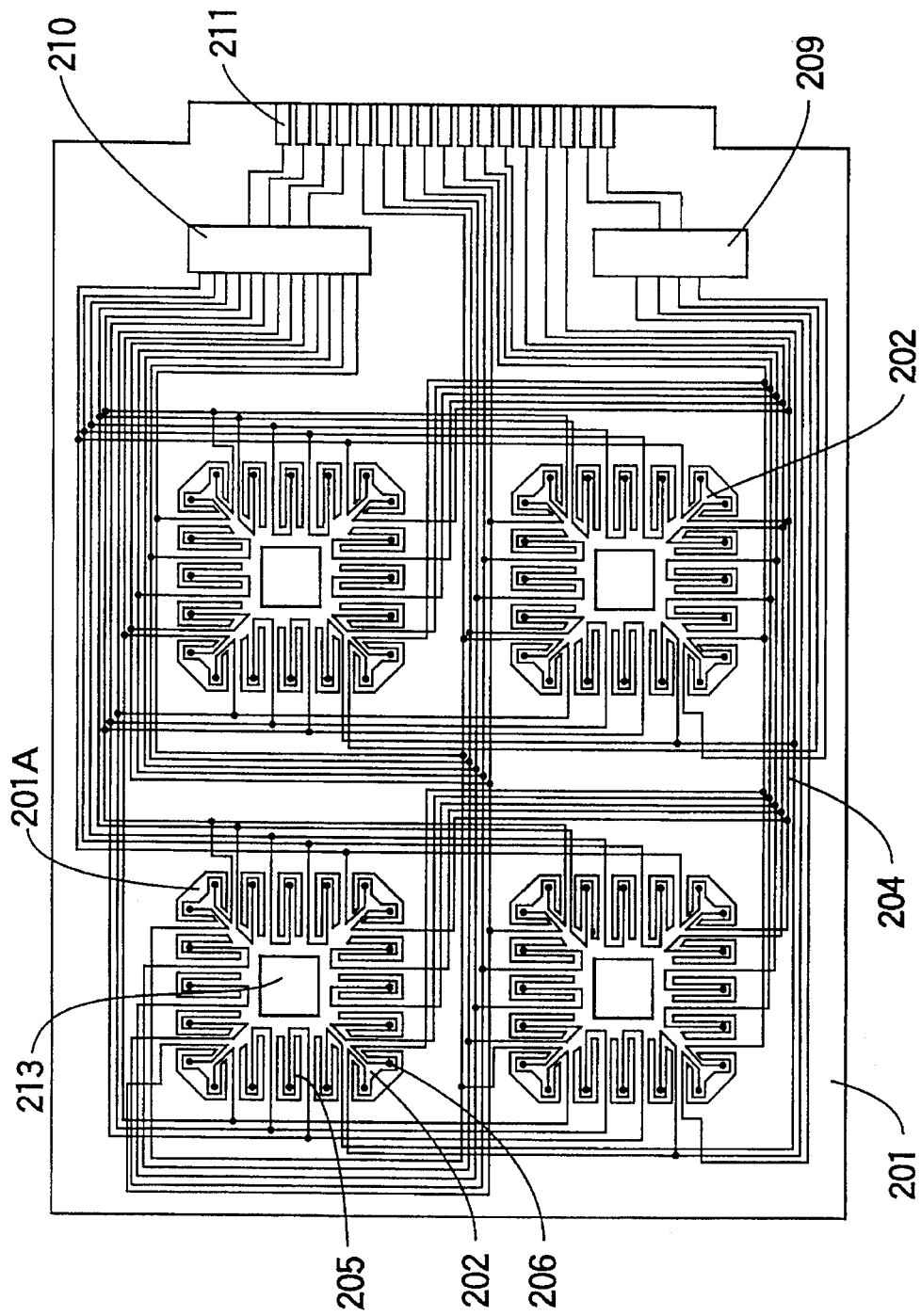
FIG. 8 is a plane view of a prober having a plurality of unit probers formed on its substrate according to the third embodiment of the present invention.

In the unit prober as described above, the leads or reeds 205 are designed to extend from inside to outside of the object to be tested, that is, from the central portion to the peripheral portion of the prober substrate 201. It is important that, according to such an arrangement, the space which the probing section (including the electric circuit paths such as electrically conductive layers 204) occupies can be made equal to or smaller than the area of a single IC element. It is, therefore, apparent that a plurality of unit probers can be formed on the prober substrate 201 at the same pitch as that of the objects to be tested on the wafer. FIG. 8 shows a prober system according to third embodiment of the present invention in which a plurality of unit probers are formed on the prober substrate. In this figure, similar reference numerals are used to indicate the corresponding parts and components of the prober in FIG. 5 and there is no need to repeat the description of those parts and elements.

In the prober system in FIG. 8, the electric circuit paths formed of numerous conductive layers 204 on the prober substrate 201 provide data or address bus lines for communication with the unit probers on the prober substrate 201. In this connection, it is noted that a bus buffer may be used for improving the bus transfer characteristics, and a decoder 209 and an encoder 210 may also be used for minimizing the number of lines extending to the external test circuit (not shown). More specifically the decoder 209 and the encoder 210 are mounted on one end portion of the prober substrate 201 for decoding assignment codes from the external test circuit to access any one of the unit probers and for encoding the output data from any of the unit probers, which contributes to decrease the number of connection terminals 211 and thus the lines between the numerous conductive layers 204 and the external test circuit.

Recently, there have increasingly been provided IC elements that have higher packaging densities of integrated circuits, complicated configurations of pads and a large number of pads. For such IC elements, according to the present invention, the probing section 202 may be formed with the different comb-shape patterns including non uniform and zigzag patterns depending upon the applications.

As described above, the semiconductor material, if used for the prober substrate 201, can achieve a higher density of circuit paths which are formed of conductive layers 204 by the same processing techniques as that of IC elements. Furthermore, if the crystalline orientation of such semiconductor material is similar to the wafer and the prober substrate is disposed relative to the wafer so as to allow its crystalline orientation to be in alignment with that of the wafer, such a prober substrate can minimize the possible positional deviation of the contacts 206 of the prober from the pads 208 of the object caused by thermal expansion or contraction.

On the other hand, if metal is used for the prober substrate, it must have substantially same thermal expansion coefficient and restoring characteristics as that of the object to be tested and it must be provided with an additional insulation film or coating by thin film application or coating techniques. In such a case, however, there may be the possibility of some deficiencies such as lower operation speed due to the increase of stray capacitance for the circuit paths including the conductive layers 204, the requirement of complicated machining, and the like.

In actually making a measurement or aging test on the wafer, the object to be tested is aligned with the prober substrate 201 and thereafter the prober substrate 201 is pressed against the object to abut the contacts 206 on the pads 208 of the object. In this connection, an excessive pressing force, if applied, can lead to breakage of both the prober and the object. In order to avoid such breakage, another prober according to fourth embodiment of the present invention is provided as shown in FIG. 9.

Figure 9:
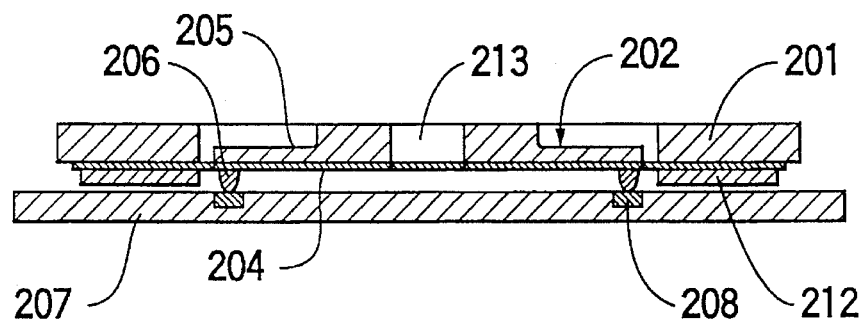
FIG. 9 is a sectional view of a prober according to the fourth embodiment, showing how the prober is applied to a selected object in probing condition.

FIG. 9 shows the prober in cross section as viewed from the position corresponding to the line A—A of FIG. 5 in which the prober is disposed above the semiconductor substrate on which IC elements are formed. In FIG. 9, similar reference numerals are used to indicate the parts and the components corresponding to those in FIGS. 5 to 7. It is apparent from FIG. 9 that the prober substrate 201 is provided with a pressure receiving portion 212 at the area other than the leads 205 of the probing section 202, the thickness of which pressure receiving portion 212 is slightly less than that of the contacts 206. When the contacts 206 on the leads 205 are made to contact the pads 208 of the semiconductor substrate 207, the slight resilient upward displacement of leads 205 may result. At this time, however, the pressure receiving portion 212 abuts on the semiconductor substrate 207 at the area other than the pads 208, thereby preventing further displacement of the leads 205 of the probing section 202. Thus, such arrangement avoids damage to the leads 205 due to the excessive displacement force and damage to the semiconductor substrate 207, the contacts 206 and the pads 208 due to the excessive pressure.

It is noted here that if the pressure receiving portion 212 is, or is in combination with, an insulation layer/film or a resilient film, both the object to be tested and the circuit paths including the conductive layers 204 will be more completely protected against the excessive pressure.

Alignment of the pads 208 with the contacts 206 may be done in a different way rather than that described in the embodiment in FIG. 5, in which the prober substrate 201 has the central opening 213 for alignment. That is to say, in order to facilitate in making alignment using an optical system as commonly used, the prober substrate 201 is formed of transparent material without such opening. Furthermore, according to the present invention, glass or ceramic material which is transparent to visible light, ultraviolet rays or infrared rays can be used for the prober substrate 201. This transparent material, together with clearance 201A around the probing section 202, facilitates alignment of the pads and the contacts.

It is to be considered here that in making simultaneous probing of a plurality of objects formed on the same substrate 207 such as a wafer, it is difficult to provide the proper contact pressure between a greater number of contacts 206 and pads 208 only, depending upon the flexibility of the leads 205 of the probing section 202, because of greater area and thus increased deformation of both the prober substrate 201 and the semiconductor substrate 207. In other words, it is difficult to provide the probing operation at higher reliability. In such circumstances, it is important that the contacts 206 are reliably abutted onto the corresponding pads 208 of the semiconductor substrate 207 by actively and resiliently biasing the leads 205 of the probing section 202.

Figure 10:
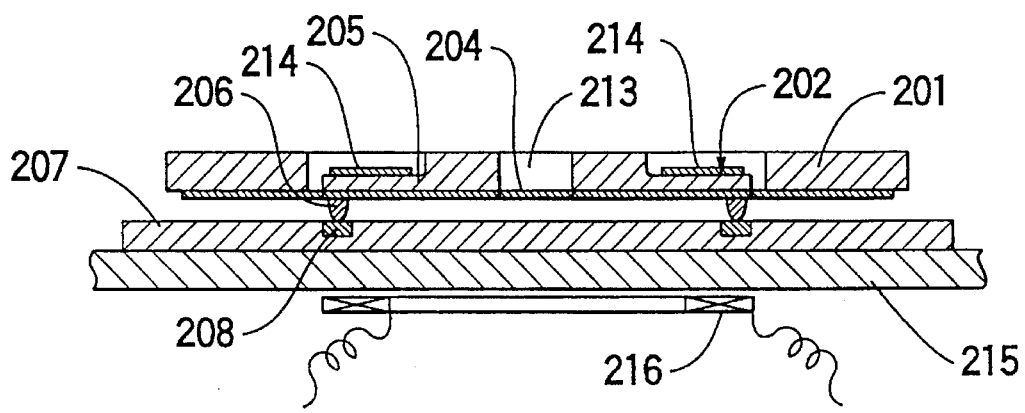
FIG. 10 is a sectional view of a prober according to the fifth embodiment, showing how the prober is applied to a selected object in probing condition.

FIG. 10 is a view similar to FIG. 9, but showing, in cross section, a prober according to fifth embodiment of the present invention. The prober of this embodiment is provided with magnetic element 214 such as permalloy which is applied at a side opposite to that on which the contacts 206 of the leads 205 are formed. A base plate 215 is provided for supporting the substrate to be tested 207. The base plate 215 includes an excitation coil 216 at the bottom side thereof. According to such arrangement, passing an electric current through the excitation coil 216 for making probing operation generates a magnetic field to attract the magnetic element 214 and thus the leads 205, thereby assuring the reliable contact between the pads 208 and the contacts 206.

According to this embodiment, the proper contact pressure can be achieved by controlling the current to the excitation coil 216. Furthermore, an alternating current or a pulsating current, if passed through the excitation coil 216, produces an oscillatory movement of the leads 205 which is effective to remove an oxide film caused on the surface of the pads 208 by the action of the contacts 206.

Evaporation, plating, electroforming, coating, application and other techniques may be used to form the magnetic element 214 at the rear side of the leads 205. The base plate 215 formed of magnetic material is preferable because it produces an averaged magnetic field near the prober substrate 201 so that lower excitation current is required.

As described above, it is difficult to make a measurement or aging test by simultaneously probing of all the objects to be tested, such as wafers, if there were defective elements included therein. According to the present invention, however, such difficulties can be overcome in such a manner that the excitation coils 216 are individually mounted on all the objects to be tested, but only the excitation coils associated with the objects including no defective elements are selectively driven. Alternatively, the leads 205 may be formed of bimorph elements and an electric voltage may be applied only to those leads which are desired to be activated in the probing section 202. In such manner, the simultaneous probing of all the objects on the wafer except for defective ones can be achieved according to the present invention.

In addition, a so called "micromachine" technique, which has now become popular, may be applied to the leads 205 of the probing section 202.

Figure 11:
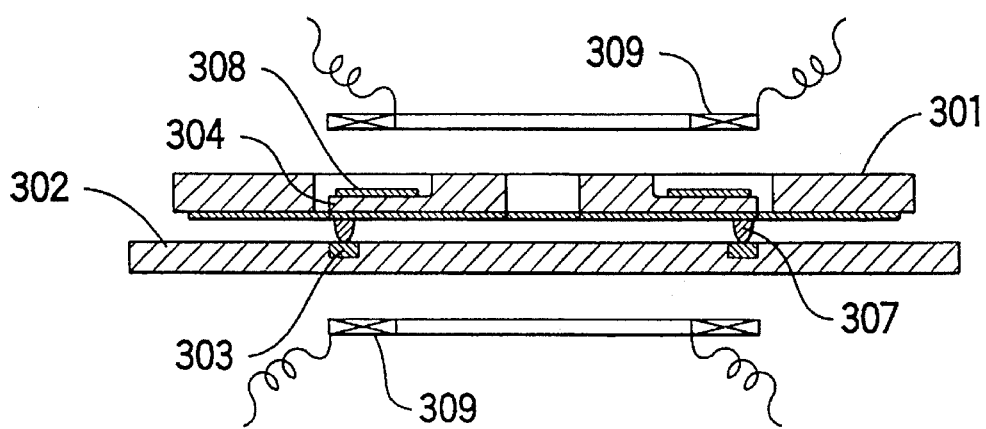
FIG. 11 is a sectional view of a prober according to the sixth embodiment, showing excitation coils arranged on opposite sides, which excitation coils constitute parts of an associated actuator.

FIG. 11 is a view similar to FIG. 10, but showing a prober according to sixth embodiment of the present invention. This prober uses a magnetic actuator which is arranged to drive each contact or each group of contacts as a unit to be controlled as a whole. The prober of this embodiment includes a prober substrate 301. The prober substrate 301 may be formed of material that has good restoring ability to resist stress and has lower thermal expansion coefficient, such as silicon or other semiconductor material, glass, ceramic, or metal with insulation coating.

In order to keep the strength or rigidity of the entire prober substrate 301, it is required that both a reinforcement plate be added to the prober substrate 301 and that the prober substrate 301 itself have substantial thickness. In contrast to that, the leads 304 require enough flexibility and resiliency to keep in good contact with the contacts and the pads while accommodating any possible warp or unevenness of the wafer. To this end, each of the leads 304 or each of the teeth of the comb-shape portions, and its surrounding portion, is formed in a certain thickness, size, shape and composition; the electric terminals and the electric circuit paths, made up of conductive films or layers, are formed on the area of the prober substrate 301 including the comb-shape portions; and projections of hard metal such as platinum, rhodium, chromium or tungsten carbide are formed for the contacts 307 on the electric circuit paths adjacent the ends of the leads 304 to complete the probing section. The electric circuit paths are formed as the printed circuit on the rear side of the prober substrate 301 for electrically connecting between the contacts 307 and the associated terminals. More specifically, the electric circuit paths serve to electrically connect between the contacts 307 contacting the corresponding pads 303 of the object under test and the terminals coupled to the main system such as a burn-in tester (not shown).

Evaporation, plating, electroforming, coating, application and other techniques may be used to form the magnetic element 308 of permalloy on the leads 304. When making a probing operation, the contacts 307 are abutted on the pads 303 of the object to be tested with the aid of the resiliency of the leads 304, and when releasing the contacts 307 from the pads 303, an electric current is passed through excitation coils 309 mounted on upper and lower sides of the prober substrate 301 as shown in FIG. 11. Then, the excitation coils 309 generate magnetic field to move the leads 304 upwardly. The magnetic member 308, together with the excitation coils 309, constitutes a magnetic actuator.

The concept of the unit prober in FIG. 11 can be extended to form a prober system in which a plurality of unit probers and the associated excitation coils 309 are arranged on the prober substrate 301 so that they correspond in number and layout to the objects to be tested. Then the simultaneous probing of all the objects can be effected with setting the distance between the unit probers and the objects at a value within the limit of resiliency of the leads 304 in order to exert the reliable contact pressure to the pads 303 of the objects.

It is preferable that the excitation coils 309 are precisely formed and arranged to suit to the individual probing sections so that control can be effected for each of the contacts. It is, however, generally satisfactory that control can be effected for each group of contacts for each probing section corresponding to each object under test.

Figure 12:
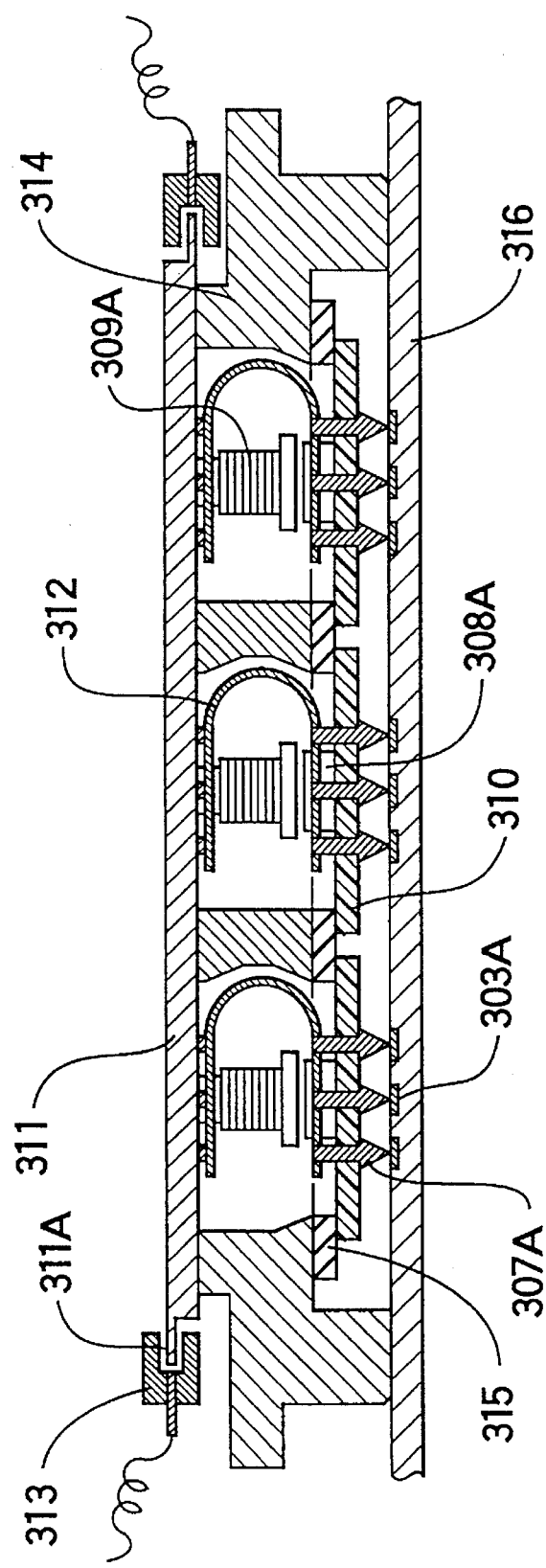
FIG. 12 is a sectional view of a prober according to the seventh embodiment, showing how the prober is used.

FIG. 12 is a view similar to FIG. 11, but showing a prober according to seventh embodiment of the present invention. The prober of this embodiment includes magnetic actuators each of which drives each contact block of plural contacts, rather than each contact, as a unit to be controlled. Each of the contact blocks includes a plurality of contacts 307A on a base plate 310 formed of plastic, ceramic or other insulation material so that the number and layout of the contacts 307A correspond to those of the pads 303A of the object to be tested.

A circuit board 311 is used for connecting between the contacts 307A on the contact blocks and the main system (not shown) via flexible printed boards 312. Although in FIG. 12 one flexible printed board 312 is provided for each of the contact blocks, this is not necessarily required. Rather, some of the contact blocks may be connected together to the circuit board 311.

The circuit board 311 serves as an interface between the main system and the printed boards 312, and is connected to the main system via a terminal portion 311A and a connector 313 formed on one end of the circuit board 311. Because of the fact that a large number of lines run in a complicated manner, the circuit board 311 is normally formed by a multi-layer printed board. Such an arrangement, however, lowers the operation speed due to the effect of input/output capacity and/or distributed capacity among the lines on the object to be tested. It is, therefore, common practice to provide an encoder and a decoder as well as a driver for handling the data or address bus lines and the timing signal lines.

It is noted that the prober in FIG. 12 has no active damping means such as the leads 304 as described above. Instead, the prober has damping means 315 mounted between the contact blocks and support members 314. Each of the damping means 315 is formed of suitable resilient material such as organic and inorganic synthetic rubber, or spring metal. The support member 314 is formed of metal or ceramic material having a lower thermal expansion coefficient.

According to such arrangement, when making measurement, any suitable external mechanism can be used to set the clearance between the support members 314 and the substrate to be tested 316 at such distance that each of contact blocks can adaptively be abutted on the substrate 316 while accommodating the surface conditions thereon within the limits of flexibility or resiliency of the base plate 310 and the damping means 315, thereby assuring reliable contact therebetween and the required contact pressure. According to the present invention, the damping means may be formed of any of the suitable resilient material or may include any damping function including combination of flexibility and resiliency of the base plate and the like.

The contact blocks are formed by use of high precision printed circuit board manufacturing techniques if the pads of the object to be tested are arranged at relatively rough pitch, or are formed on the silicon or other semiconductor substrate by use of IC manufacturing techniques if the pads are arranged at fine pitch. In any case, the contacts 307A and the associated electric circuit paths can be formed by either the printed circuit board or IC manufacturing techniques. More specifically, the contacts 307A are formed to have tip portions so that in making probing operation those tip portions stick into the pads 303A, thereby enabling breakage of oxide film thereon and accommodating some unevenness of the substrate in the area of each contact block.

In order to make the probing operation relative to the pads of the object to be tested while driving each of the contact blocks as a unit to be controlled, magnetic element 308A is mounted on each contact block, and control of electric current to each excitation coil 309A is effected as shown in FIG. 12.

In order to make the probing operation for pellets or wafers on which a plurality of objects to be tested are mounted, a plurality of excitation coils are operated in a unit to be controlled, and a selection means for selecting current to any of the excitation coils is provided, thereby enabling assignment and control of measurement/non measurement.

Figure 13:
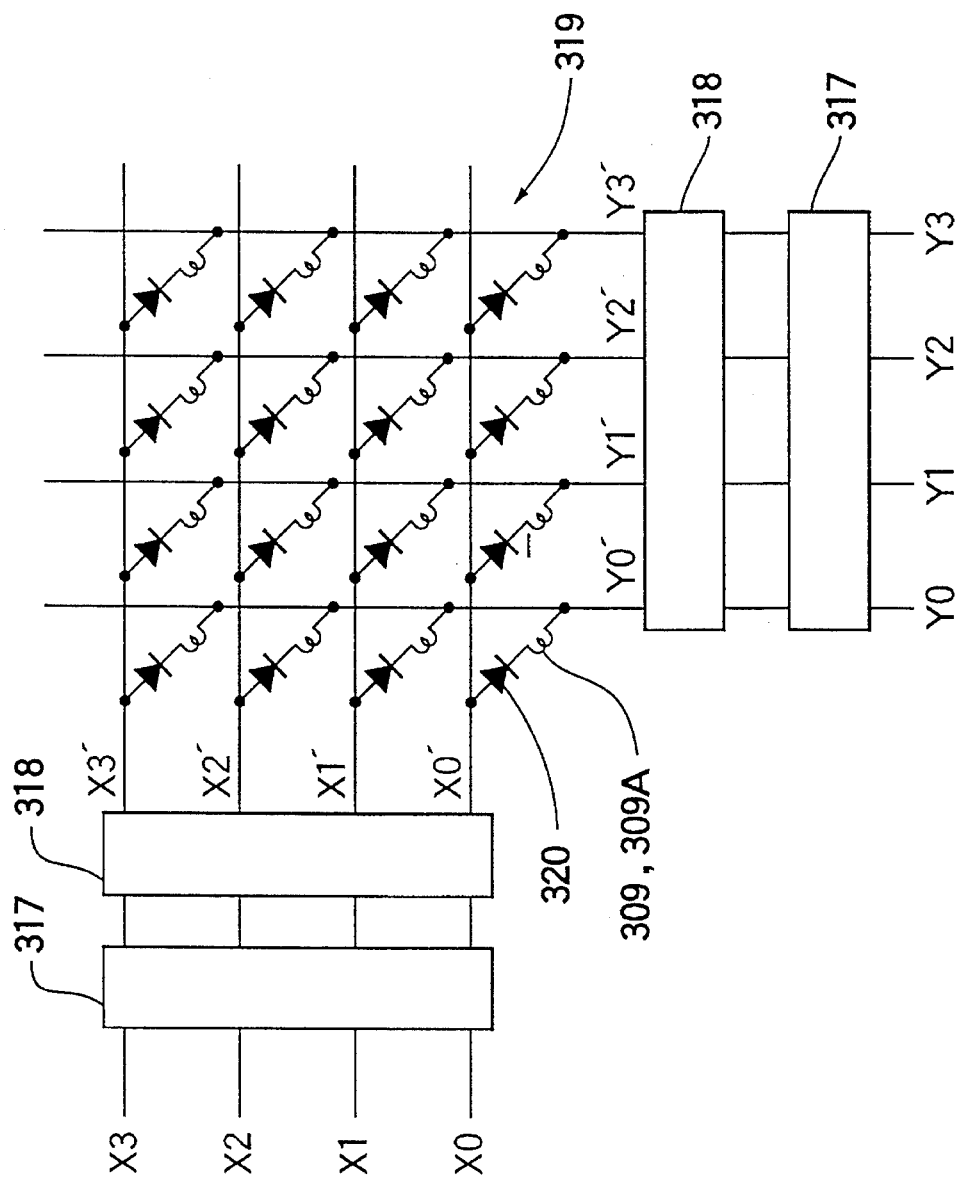
FIG. 13 is a wiring diagram of a switching matrix to permit selection of actuators used in a prober according to the present invention.

FIG. 13 is a schematic diagram showing a selection means arranged in matrix form by which the actuator performs selection operation in said unit to be controlled. This selection circuit is arranged so that source selection inputs X0–X3 and sink selection inputs Y0–Y3 drive the matrix circuit 319 formed on the printed circuit board through latches 317 formed by flip-flops and current drivers 318. Because the current drivers 318, connecting to drive lines X0'–X3' and Y0' Y3' for matrix circuit 319, have sink and source functions, respectively, assignment of the source selection inputs X0–X3 and the sink selection inputs Y0–Y3 can selectively drive the desired excitation coils 309 and 309A.

Diodes 320 are provided in combination with the excitation coils 309 and 309A for preventing "wrap-around" current from driving non-selected excitation coils.

In the embodiments as shown in FIGS. 11 and 12, adjustment of current to the excitation coils 309 and 309A can control the strength of the contact pressure. In addition, use of the current including DC component and AC or pulsation component passed through the excitation coils can produce an oscillatory movement of the contacts against the pads at the time of selective driving of the contacts or the contact blocks. Generally, the pads 303 and 303A of the object to be tested, such as an IC element, tend to produce oxide film on the surface thereof which increases the electric contact resistance. According to this arrangement, however, great advantage can be achieved in that such oxide film can be removed by the oscillatory movement of the contacts against the pads.

In addition, if the magnetic element 308 is formed of a material that has higher coercive force, for example, magnetic steel and is magnetized, then the changing in direction of current to the excitation coils 309 and 309A can control the abutting/releasing of the contacts 307 and 307A relative to the pads 303 and 303A.

Although, in the embodiment of FIG. 12, the excitation coils 309A are disposed above the prober substrate 310 for attracting the magnetic elements 308A, the excitation coils may be disposed under the prober substrate 301 as in the case of FIG. 11.

Coils formed of normal metal wires, printed coils produced by use of printed circuit board manufacturing techniques or printing techniques, and other coils produced by evaporation techniques may be used for the excitation coils 309 and 309A. In this connection, it is noted that in order to increase inductance, the printing with magnetic ink, electrophoresis or adhesion may be used to add the magnetic element block to the individual printed coils.

Furthermore, for the purpose of keeping lower power consumption and of avoiding heating, the magnetic element having higher coercive force is affixed to the contacts or contact blocks. The magnetic element is then permanently magnetized by a magnetic field produced from the excitation coils on the base plate so that the excitation coils can keep a controlled condition only by a momental energization thereof, and, further, the excitation coils can be initialized by AC magnetic field applied thereto. Alternatively, other processings also may be done in which a permanent magnet is used for the magnetic element; the excitation coils are provided with cores formed of material having higher coercive force; and the excitation coils are magnetized in the same or opposite polarity to that of the permanent magnet to make control of attraction/repulsion.

Because of the requirement that the contacts 307 and 307A in FIGS. 11 and 12 be wear resistant, the contacts, having such characteristics, may be formed on the base plate 310, after forming the contacts by plating or electroforming of hard metal, such as platinum, platinum-rhodium and chromium, or by plating or electroforming of common metal in increased thickness, by once again repeating plating of hard metal on the resulting contacts. An ion implantation or nitrogen processing technique may be used to form hard metal film on the surface of the contacts, or pre-formed contacts 307A of tungsten carbide may be affixed by melting or conductive adhesive.

In the embodiments as described above, the magnetic type actuator is used for selectively driving one contact or one contact block in a unit to be controlled. It is apparent for those skilled in the art that the present invention is not limited to such an actuator, but that any suitable actuator based upon the different principles can be used without departing from the present invention. In principle, any of the actuators based upon a physical phenomenon or mechanism for exerting attractive force, repulsive force, or displacement may be put into practice.

For example, a magnetic attraction or repulsion mechanism using ceramic, a hydraulic mechanism using fluid such as air or liquid, a shape memory alloy or bimetal, and magneto or electro striction effects may be used for the actuator. More particularly, a "micromachine" technique which has undergone remarkable progress, can usefully applied to such an actuator.

Furthermore, in addition to an electro magnet, any of thermal deformable means such as a bimetal, a combination of polyimide or other plastic materials, each having different thermal expansion coefficient and behaving in the same manner as bimetal, a shape memory alloy, or shape memory plastic can be used to make control of abutting/releasing of contacts or each contact block relative to the pads.

More specifically, instead of the excitation coils selected by the matrix circuit 319 in FIG. 13, fine heaters are formed on each probing section or each block corresponding to each object to be tested by use of a printing technique. Then, the fine heaters are selectively energized by assignment of source selection inputs X0–X3 and sink selection inputs Y0–Y3 so that the thermal deformation of the associated bimetal, shape memory alloy or shape memory plastic is produced, thereby enabling control of abutting/releasing of each contact or each contact block relative to the pads.

Although, in FIG. 13, the electrical matrix circuit 319 is used as a selection means, the present invention is not limited to such selection means, but any of equivalent circuits may be used. In case that fluid, such as air or liquid, is used for control medium, instead of electric means, electro magnetic valves, tubings or any other fluid control mechanism can be used for the selection purpose.

As already described, various actuators and the selective driving means can be used for controlling the abutting/releasing of the contacts relative to the pads in a unit to be controlled. Furthermore, according to the present invention, at the initial step of probing, a good/defect pattern for individual objects to be tested on the wafer is determined and stored in memory of the main system. Thereafter, with reference to such good/defect pattern, control of the abutting/releasing of the contacts or contact blocks relative to the pads can be performed. Such an entire system configuration, including the memory, can achieve highly efficient burn-in or measurement only for non defective objects without useless measurement of defective objects.

In the prober of such an embodiment, provision of damping means on each contact, each group of contacts or each contact block can achieve compensation for entire warp or bend of the object's substrate on which a plurality of objects are formed. Such damping means may be constituted by a combination of flexible and resilient leads and contacts that are arranged in corresponding to the pads of the objects; utilization of the flexibility of the base plate for the contact blocks (or otherwise after making such base plate flexible by some machining); and provision of separate flexible and resilient members for each of contact blocks. In order to compensate for local unevenness of the object's substrate, the contacts of fixed shape and fixed size may be used; or the contacts having tips formed thereon may be used so that at the time of probing such tips stick into the pads at different depths depending on the degree of local unevenness, thereby accommodating the same. If it is expected that there is no such local unevenness of the object's substrate, metal spheres of fixed size and fixed shape may be used for the contacts.

In this prober, the actuators can be selectively energized by preferably a matrix type selection means for selective driving of each of the contacts. Further, the actuators can also be arranged for selective driving of only such contacts that correspond to nondefective objects according to the good/defect pattern of the objects as stored at the time of the previous measurement therefor.

Such actuators may use attraction/repulsion due to magnetic/electric field, magneto striction and electro striction effects, and are arranged to drive each of the contact blocks of a plurality of contacts for controlling the abutting/releasing of the contacts of each contact block relative to the corresponding pads as a unit to be controlled. Further the actuators may use the mechanical control means for controlling the abutting/releasing, for example, bendable elements such as bimetal, bimorph, shape memory alloy or polymer, and contraction/expansion elements such as a polymer. In addition, the actuators may use a preferably "micro-machine" technique which is now popular, one example of which is a micro-actuator utilizing an electric attraction/repulsion effect in the dielectric material such as ceramic.

According to the present invention, the actuators each for driving each of the contact blocks 310 as shown in FIG. 12 can be replaced with movable means for driving all the contacts 307A to the object's substrate 316 at a time. Such movable means or actuator is shown in cross section in FIG. 14.

As shown in FIG. 14, the movable portion A of the prober is positioned relative to an IC wafer 402 on which the objects to be tested are formed. The contact blocks 404, each having a group of contacts, are formed by use of printed circuit board manufacturing technique so that the contacts correspond in their layout to the pads 403 in IC pattern formed on the surface of wafer 402 which is carried on a base plate 401. Referring to FIG. 15 in which one contact block is shown, a plurality of contacts 405 are formed in a contact plane relative to the wafer 402 on the base plate 401 of plastic, ceramic or other insulation material, and are connected to their back round portions 406 by use of through-hole technique.

The back round portions 406 are connected through flexible printed circuit boards or lead boards 408 to a circuit board 407 for communication with the main system. It is noted that the lead boards 408 are not necessarily be provided one for each contact block 404, but some number of the contact blocks could be connected together to the circuit board 407.

The circuit board 407 for interfacing between the lead boards 408 and the main system is formed by a multi-layer printed circuit board and is communicated with the main system via a contact portion 407A and a connector 409. The multi-layer printed circuit board is used for the reason that a large number of various lines run in complicated manner, but the capacitance of object's inputs and output and the distributed capacitance among the lines lower the operation speed. It is, therefore, necessary to include a driver for handling data or address bus lines and timing signal lines.

A plurality of contact blocks 404 are affixed to a support plate 411 made of resilient or flexible material such as beryllium copper, both end portions of which support plate 411 are affixed to a movable base frame 410.

Preferably, the support plate 411 is secured in position by support members 412 due to the fact that the support plate 411 will downwardly bend in the center portion thereof when released from the IC wafer 402.

Depending upon the conditions of the objects to be tested, the support members 412 are made of rigid material, such as metal, or resilient material, such as synthetic rubber. In the former case, they may be integral with the movable base frame 410.

According to such arrangement, in order to make measurement, the movable portion A is gradually lowered with the movable base frame 410 activated by an external mechanism. After the contacts 405 of the contact blocks 404 contact to the pads 403 on the wafer 402, fine adjustment of further downward movement can be effected to adaptively and individually abut the contacts of the contact blocks 404 on the pads while accommodating the surface conditions of the wafer 402 within the limit of the resiliency of the support plate 411, thereby assuring reliable contact and required contact pressure. Furthermore, the optimum contact condition of the contacts and the pads can be achieved by providing curved portions 411A and frames made of a thicker rigid member at the desired positions for improving the entire rigidity of the support plate 411 and the positional precision of the contact blocks 404.

The contact blocks 404 are formed by use of high precision printed circuit board manufacturing techniques if they are arranged at relatively rough pitch, or they are formed on the silicon or other semiconductor substrate by use of IC manufacturing techniques if the pattern interval of the elements on the wafer is smaller than a few tens g m. In any case, the contacts 405 of the contact blocks 404 are coated with thicker gold or other films.

Referring to FIG. 16, each of the contacts 405 of the contact block 404 comprises a thin rod, a lower end of which is provided with a contact portion. The upper end of the rod is directly or indirectly grasped by a resilient or flexible member, for example, it is adhered to the lead board 408. Thus the contacts are freely upwardly and downwardly movable within the respective holes in the base plate 404A. Such arrangement can assure the reliable contact even for poor surface condition of the object under test.

The lead boards 408 may be replaced with flat -cables consisting of thin wires.

For an application requiring less precision, a common flexible printed board may be used to form both the contact block 404 and the support plate 411. In such a case, however, because no curved portions 411A are present, the common board requires reinforcement by a metal or other thicker board made of same material as that of the common board.

In the embodiment above, the compression relation among the contact blocks 404, the wafer 402 and the movable portion A is determined substantially based upon the resiliency of the support plate 411 and the length of downward movement of the movable portion A. In this connection, it is noted that fluid such as gas or liquid may be used for fine adjustment of such relation.

Figure 17:
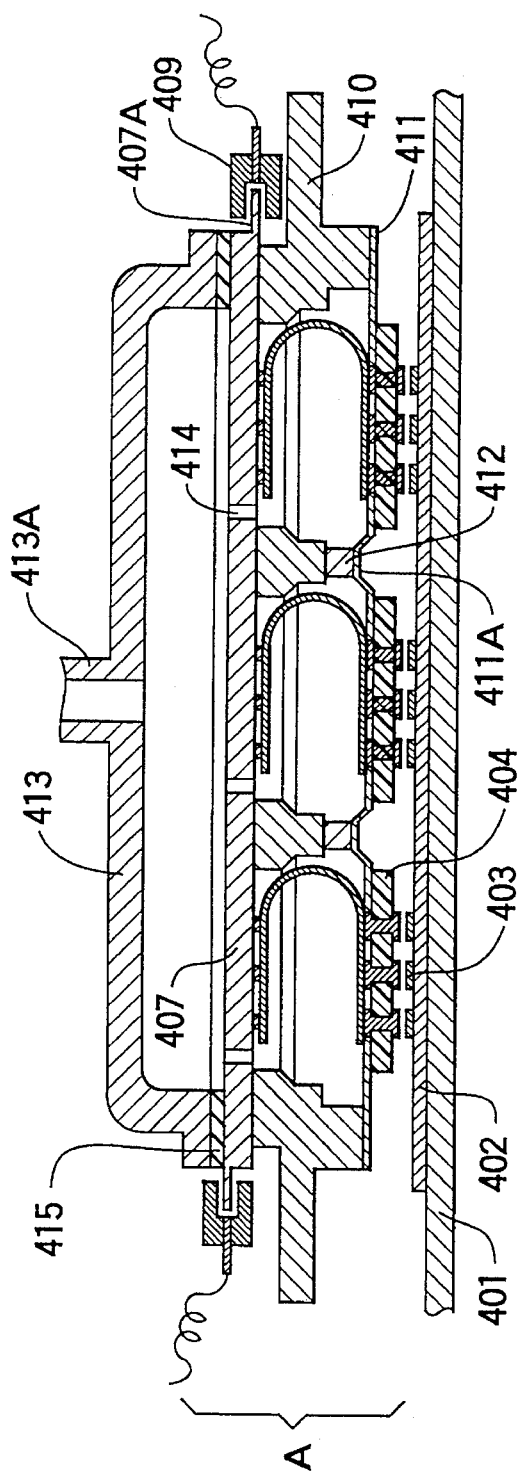
FIG. 17 is a sectional view of a prober according to the ninth embodiment, showing how the prober is applied to a selected object.

FIG. 17 shows a prober in which gas is used for fluid. The gas from an external pump flows through a conduit 413A into an enclosure 413 and then via vent holes 414 each provided in the movable base frame 410 and the circuit board 407 into spaces defined by the movable base frame 410, the support plate 411 and the contact blocks 404. Adjustment of the gas pressure enables fine adjustment of the positions of the contact blocks 404.

In order to keep gas tight condition between the circuit board 407 and the enclosure 413, a seal 415 made of synthetic rubber or other resilient material is used.

According to such arrangement, after the movable portion A is mechanically driven to near the semiconductor wafer 402, the gas at predetermined pressure is supplied through the vent holes 414 to produce slight downward movement of the contact blocks 404, thereby assuring reliable contact to the pads 403.

In order to highly adaptively abut the contacts against the surface condition of the wafer, in other words, in order to individually operate the related portions for each of the contact blocks 404, framework having desired shape and made of metal or other rigid material can be affixed to the support plate 411.

Although, in such an embodiment, the same pressure gas is supplied through all the vent holes 414 due to the provision of the enclosure 413, it may be possible to couple the separate conduit to each vent hole 414 without the enclosure 413 and adjustment of gas pressure for each of the vent holes enables control of contact timing and contact pressure for each of the contact blocks 404.

It is noted here that if the contact block 404 of this prober is replaced with the contact block 404 as described with reference to FIG. 16, the contacts of such contact block can be highly adaptively abutted on the object surface due to greater range of movement of each contact.

Figure 19:
FIG. 19 is a similar sectional view, but showing another example of a contact.
Figure 18:
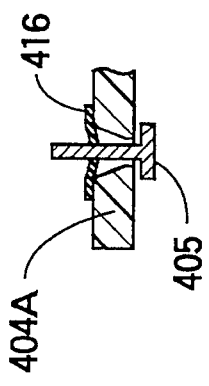
FIG. 18 is an enlarged sectional view of a contact belonging to a selected contact block.

FIG. 18 shows an example in which a contact 405 is supported by a support membrane 416 formed of resilient or flexible material such as synthetic rubber and deformation of the support membrane 416 under pressure is transmitted to the contact 405. FIG. 19 shows another example in which the contact 405 is replaced with a thin film contact 417 formed of flexible or resilient metal such as gold or beryllium. The thin film contact 417 is coupled to a rear contact 406 via a through-hole. The thin film contact 417 is designed so that it is stretched out due to the fluid pressure applied through an opening 414A in the base plate 404A.

Furthermore, the contact 405 may be replaced with, for example, a capillary tube type contact formed by a through-hole technique in which the tube contains electrically conductive liquid and the degree of projection of the tube due to its surface tension is controlled based upon the fluid pressure; and an electric contact formed by a "micromachine" technique that has now made remarkable progress.

Thus far described is that which uses the air at positive pressure. This may be replaced with the air at negative pressure. More particularly it is possible that the vent holes 414 are opened to atmosphere, the rest portions are made air tight and a vacuum pump is used to evacuate the air inside. Adjustment of such pressure can provide reliable contact relative to the object's surface.

Figure 20:
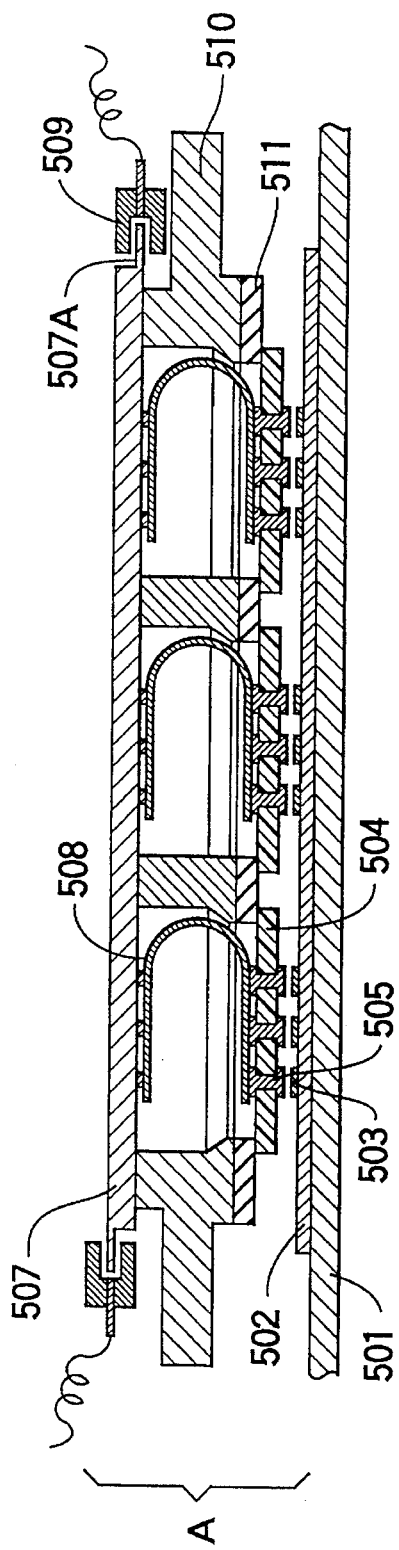
FIG. 20 is a sectional view of a prober according to the tenth embodiment, showing how the prober is applied to a selected object.

FIG. 20 is a cross sectional view of a prober according to further embodiment of the present invention. As shown in this figure, a movable portion A of the prober is positioned relative to an IC wafer 502 on which the objects to be tested are formed. Contact blocks 504, each having a group of contacts, are formed by use of printed circuit board manufacturing technique so that the contacts correspond in their layout to the pads 503 in IC pattern formed on the surface of wafer 502 which is carried on a base plate 501. As shown in FIG. 20, a plurality of contacts 505 is formed in a contact plane relative to the wafer 502 on the base plate 501 of plastic, ceramic or other insulation material, and are connected to their back round portions by use of through-hole technique.

The back round portions are connected through flexible printed circuit boards or lead boards 508 to a circuit board 507 for communication with the main system. It is noted that the lead boards 508 are not necessarily be provided one for each contact block 504, but some number of the contact blocks could be connected together to the circuit board 507.

The circuit board 507 is communicated with the main system via a contact portion 507A and a connector 509 both of which are formed on the end portion of the circuit board 507. The contact blocks 504 are coupled via damping portions 511 formed of flexible or resilient material such as synthetic rubber to a movable base frame 510 having sufficient rigidity. If use is made of so called "unisotropic conductive rubber" which has conductivity only in vertical direction, such material can be used for both the damping portions 511 and the connecting means 508, thereby simplifying the processings from both points of view, i.e., mechanism and manufacturing. The unisotropic conductive rubber includes thin metal wires or thin conductive wires of carbon fiber or conductive rubber which are buried vertically in Teflon or other resilient macromolecule substrate at fine pitch of 0.05–0.2 mm. Therefore the unisotropic conductive rubber is resilient and conductive in only vertical without any mutual conduction among the thin conductive wires. As an example, the unisotropic conductive rubber may be used in such way that back round portions are formed on the base plate of the contact block 504 each corresponding to each contacts 505, other round portions of same size and layout as said back round portions are formed on the circuit board 507 so that both round portions are opposed to each other, and the unisotropic conductive rubber is used to connect therebetween. In such case the unisotropic conductive rubber provides both damping and electric connection functions. In addition, adhesion of the circuit board 507 to the movable base frame 510 assists to restore any warp of the circuit board 507 and to improve the parallelism of the circuit board 507 relative to base plate of the contact blocks 504.

According to such an arrangement, the resiliency of the damping portions 511 causes each of the contact blocks 504 to adaptively be abutted on the wafer while accommodating the surface condition thereof, with the result that reliable contact and required contact pressure can be assured.

The connection means 508 may be formed of thin wire flat cable, unisotropic conductive rubber as described above, and common wiring material. For an application requiring less precision for the objects, the contact blocks 504 may be formed on the same and common printed circuit board.

Figure 21:
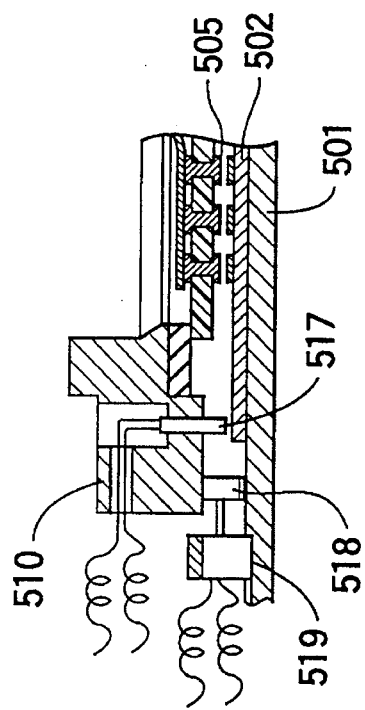
FIG. 21 is a sectional view of a fragment of a prober according to the eleventh embodiment, showing how the prober is applied to a selected object.

The reliable contact between the contacts 505 and the pads 503 depends upon how to precisely adjust the distance between the movable portion A and the wafer 502. According to the present invention, therefore, fine adjustment of such distance can be effected as follows: At the time of making measurement, the movable portion A is gradually lowered to a position near the wafer 502 with the movable base plate 510 activated by an external mechanism, and thereafter, as shown in FIG. 21, non-contact type displacement sensor 517 is used to determine the distance to the wafer 502. The value of distance thus determined is then sent to input of an external controller, and depending on the result of arithmetic operation, a servo motor 519 having reduction gears included therein and an eccentric cam 518 coupled thereto are driven to effect fine adjustment of the distance. Those additional components making up the fine adjustment mechanism are dispersedly positioned on the end portions of the base plate 501 and the movable base frame 510.

Additionally, according to such fine adjustment mechanism, control of parallelism of the base plate 501 or wafer 502 relative to the movable portion A can be achieved by adjusting the eccentric cam 518 to be equal to the distance measurement taken by the displacement sensor 517.

In the embodiment above, the compression relation among the contact blocks 504, the wafer 502 and the movable portion A is determined substantially based upon the resiliency and flexibility of the damping portions 511 and the distance of downward movement of the movable portion A. In this connection, it is noted that fluid such as gas or liquid may be used for fine adjustment of such relation.

Figure 22:
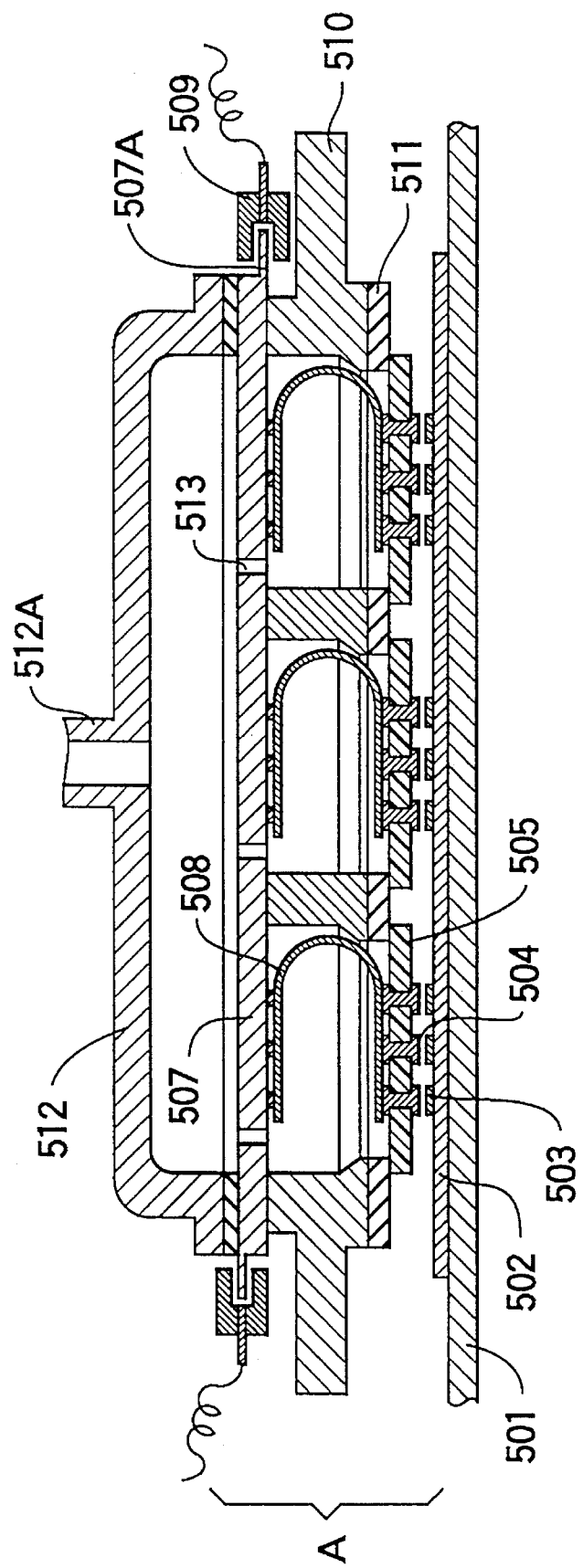
FIG. 22 is a sectional view of a prober according to the twelfth embodiment, showing how the prober is applied to a selected object.

FIG. 22 shows a prober in which gas is used for fluid. The gas from an external pump flows through a conduit 512A into an enclosure 512 and then via vent holes 513 each provided in the movable base frame 510 and 15 the circuit board 507 into spaces each defined by the movable base frame 510, the damping portions 511 and the contact blocks 504. Adjustment of the gas pressure enables fine adjustment of the positions of the contact blocks 504.

In order to keep gas tight condition between the circuit board 507 and the enclosure 512, a seal 514, made of synthetic rubber or other resilient material, is used.

According to such arrangement, after the movable portion A is mechanically driven to near the semiconductor wafer 502, the gas at predetermined pressure is supplied through the vent holes 513 to produce slight projection of the contact blocks 504, thereby assuring reliable contact to the pads 503.

In this embodiment, the damping portions 511 are formed of resilient or flexible material such as synthetic rubber. More specifically, diaphragms or bellows formed of metal such as beryllium or plastic may be used for such purpose.

In order to avoid complication of an alignment mechanism for automatically aligning positions of the contacts 505 and the pads 503, and to eliminate damage to wafers and facilitate making the mechanism dust free, a simplified and effective approach may be put into practice in which only a combination of the movable portion A, the base plate 501 and the wafer 502 is entered into a single container, alignment of positions is effected manually or by use of the alignment mechanism outside the container, the container is closed by a cover, and the circuit board 507 is connected to the main system via connectors and terminals outside the container.

It is apparent from the foregoing that the prober according to the present invention is so arranged that the space occupied by its probing section is equal to or smaller than the area of an object to be tested, for example, an IC element. Such arrangement of the prober enables not only probing of individual objects separately, but also simultaneous probing of a plurality of objects or probing of even an entire wafer by use of a multi-prober system configuration.

The present invention provides significant advantages in that integrated circuit production lines incorporating the prober of the present invention and the main system only require that, after producing IC elements on wafers, aging and characteristics test are conducted thereon, defective elements or products, if found, are rejected, and operation check is conducted at the final step. This will substantially improve the efficiency with which integrated circuits are produced, and will be advantageous, particularly to selling of integrated circuits in the form of pellets, which is commonly called "chip selling".

Furthermore, the prober of the present invention enables simultaneous probing of a plurality of objects to be tested formed on a pellet or a wafer which is potentially higher in provability of including defective elements. As an example, aging or characteristic test are conducted at a wafer level and prior to the dicing of wafers to detect and reject any defective products, thereby allowing only non defective products to proceed to subsequent steps. This will also substantially improve the efficiency with which integrated circuits are produced, and will be advantageous particularly to "chip selling".

In other words, the present invention clearly solves the difficulties pertaining the selective control of abutting/releasing of individual contacts or individual groups of the contacts as an unit, which was one of the main factors of prior art probers that has impeded the realization of simultaneous probing of the plural objects to be tested. Thus, it is apparent that the burn-in tests and measurements can be conducted at the early stage of the production line of semiconductor integrated circuit products, that is, while they are still at a wafer level, which represents remarkable progress in the semiconductor industry.

What is claimed is:

1. A prober for use in testing an electric performance of a plurality of objects to be tested formed on a substantially flat substrate, comprising:

a prober substrate having top and bottom surfaces and a thermal expansion coefficient which is substantially the same as that of said flat substrate, a plurality of reeds defined at a probing section in a center portion of said prober substrate by clearances formed through said prober substrate to extend from its top surface to its bottom surface, the bottom surface of said reeds being coplanar with the bottom surface of the prober substrate, a plurality of contacts for abutting on a corresponding one of a plurality of pads of each object when the prober substrate is positioned on the flat substrate with its bottom surface facing the flat substrate, each contact being provided on one of said reeds in a vicinity of a free end thereof at the side of the bottom surface of said prober substrate, and a plurality of conductive layers formed on the coplanar bottom surfaces of said reeds and said prober substrate, each of said conductive layers having one end connected to a corresponding one of said contacts and the other end extending beyond the root end of the corresponding reed to a body portion of said prober substrate to allow termination adjacent to an outer circumference of the prober substrate.

2. A prober according to claim 1, wherein said reeds are positioned in interdigitated form.

3. A prober according to claim 1, wherein said prober substrate includes a plurality of probing sections which correspond in number and positions to semiconductor integrated circuit elements formed on said substantially flat substrate.

4. A prober according to claim 1, wherein each of said reeds has a thickness less than that of said prober substrate and said prober substrate has pressure receiving portions on a surface which is the same as that on which said contact is formed, each pressure receiving portion having a smaller thickness than a thickness of the contact.

5. A prober according to claim 3, wherein said prober substrate is formed of a semiconductor material which is substantially the same as that of said substantially flat substrate, and the prober substrate and said probing sections have a crystalline orientation relation which is the same as a crystalline orientation relation of the substantially flat substrate and said semiconductor integrated circuit elements.

6. A prober according to claim 1, wherein said reeds include biasing means for receiving an external force while in a no contact condition after said prober substrate is positioned on said substantially flat substrate and making reliable contact between the contacts and said pads.

7. A prober according to claim 6 which said biasing means are selectively operated.

8. A prober according to claim 1, wherein said prober substrate is formed of a material which is transparent to any of visible light, ultraviolet rays and infrared rays.

9. A prober according to claim 1, wherein said prober substrate is formed with an opening for alignment in position of said semiconductor integrated circuit elements on said substantially flat substrate.

* * * * *